United States Patent
Kihara et al.

(10) Patent No.: US 10,714,340 B2
(45) Date of Patent: *Jul. 14, 2020

(54) METHOD FOR PROCESSING WORKPIECE

(71) Applicant: TOKYO ELECTRON LIMITED, Tokyo (JP)

(72) Inventors: Yoshihide Kihara, Miyagi (JP); Toru Hisamatsu, Miyagi (JP); Tomoyuki Oishi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 29 days.

This patent is subject to a terminal disclaimer.

(21) Appl. No.: 16/089,024

(22) PCT Filed: Mar. 27, 2017

(86) PCT No.: PCT/JP2017/012407
§ 371 (c)(1),
(2) Date: Sep. 27, 2018

(87) PCT Pub. No.: WO2017/170411
PCT Pub. Date: Oct. 5, 2017

(65) Prior Publication Data
US 2019/0108997 A1    Apr. 11, 2019

(30) Foreign Application Priority Data

Mar. 29, 2016 (JP) ................. 2016-065806
Jul. 27, 2016 (JP) ................. 2016-147477

(51) Int. Cl.
*H01L 21/302* (2006.01)
*H01L 21/027* (2006.01)
(Continued)

(52) U.S. Cl.
CPC ............ *H01L 21/0276* (2013.01); *G03F 1/48* (2013.01); *G03F 1/80* (2013.01); *H01J 37/32* (2013.01);
(Continued)

(58) Field of Classification Search
CPC ......... H01L 21/02164; H01L 21/02219; H01L 21/0228; H01L 21/0273; H01L 21/02274;
(Continued)

(56) References Cited

U.S. PATENT DOCUMENTS

2019/0131141 A1* 5/2019 Kihara .............. H01L 21/31116

FOREIGN PATENT DOCUMENTS

JP     2003-507880 A    2/2003
JP     2008-060566 A    3/2008
(Continued)

OTHER PUBLICATIONS

Papalia et al., Applications for Surface Engineering using Atomic Layer Etching, IBM T.J. Watson Research Center, Yorktown Heights, NY, USA (Year: 2016).*

(Continued)

*Primary Examiner* — Brook Kebede
(74) *Attorney, Agent, or Firm* — Studebaker & Brackett PC

(57) ABSTRACT

According to an embodiment, a wafer W includes a layer EL to be etched, an organic film OL, an antireflection film AL, and a mask MK1, and a method MT according to an embodiment includes a step of performing an etching process on the antireflection film AL by using the mask MK1 with plasma generated in a processing container 12, in the processing container 12 of a plasma processing apparatus 10 in which the wafer W is accommodated, and the step includes steps ST3a to ST4 of conformally forming a protective film SX on the surface of the mask MK1, and (Continued)

steps ST6a to ST7 of etching the antireflection film AL by removing the antireflection film AL for each atomic layer by using the mask MK1 on which the protective film SX is formed.

20 Claims, 6 Drawing Sheets

(51) Int. Cl.
 H01L 21/311 (2006.01)
 G03F 1/80 (2012.01)
 G03F 1/48 (2012.01)
 H01L 21/02 (2006.01)
 H01L 21/033 (2006.01)
 H01J 37/32 (2006.01)
 H01L 21/3213 (2006.01)

(52) U.S. Cl.
 CPC ...... *H01L 21/0228* (2013.01); *H01L 21/0273* (2013.01); *H01L 21/0275* (2013.01); *H01L 21/02164* (2013.01); *H01L 21/02219* (2013.01); *H01L 21/02274* (2013.01); *H01L 21/0337* (2013.01); *H01L 21/31116* (2013.01); *H01L 21/31138* (2013.01); *H01L 21/31144* (2013.01); *H01L 21/32139* (2013.01); *H01J 2237/334* (2013.01)

(58) Field of Classification Search
 CPC ............. H01L 21/0275; H01L 21/0276; H01L 21/0337; H01L 21/31116; H01L 21/31138; H01L 21/31144; H01L 21/32139; G03F 1/48; G03F 1/80; H01J 37/32
 USPC ................................. 438/700, 689, 694, 702
 See application file for complete search history.

(56) References Cited

FOREIGN PATENT DOCUMENTS

| | | |
|---|---|---|
| JP | 2012-028603 A | 2/2012 |
| JP | 2013-178574 A | 9/2013 |
| JP | 2014-075567 A | 4/2014 |
| JP | 2014-107520 A | 6/2014 |
| JP | 2015-026849 A | 2/2015 |
| WO | 01/12873 A1 | 2/2001 |
| WO | 2004/034445 A2 | 4/2004 |
| WO | 2015/019765 A1 | 2/2015 |

OTHER PUBLICATIONS

International Search Report issued in PCT/JP2017/012407; dated Apr. 25, 2017.

* cited by examiner

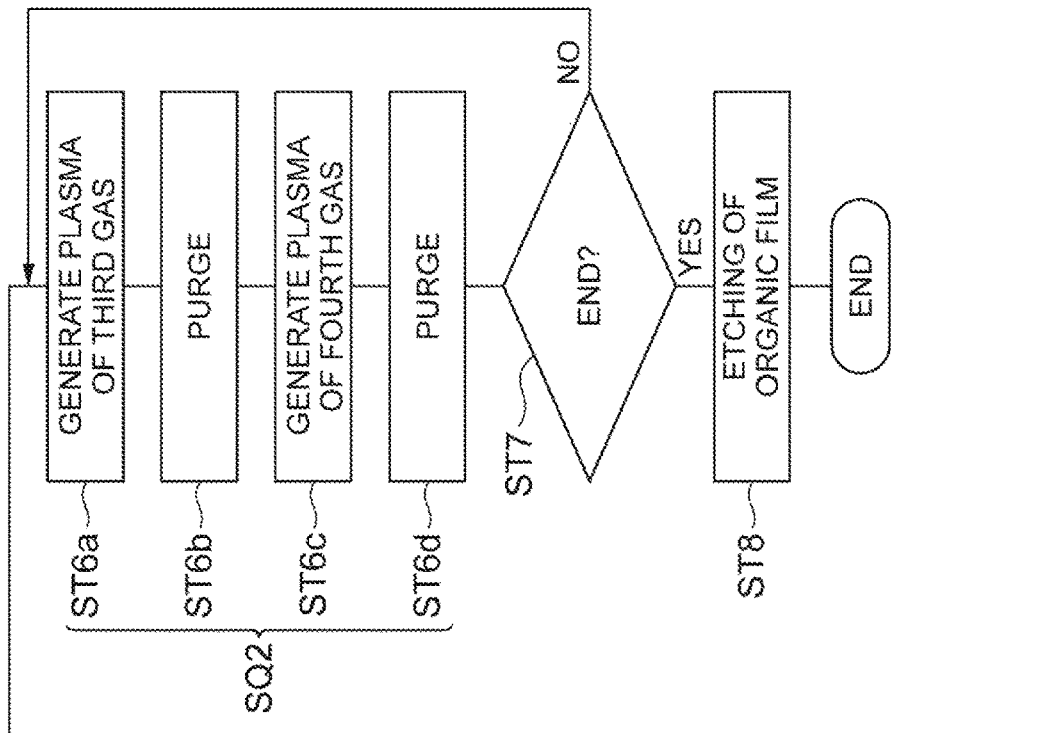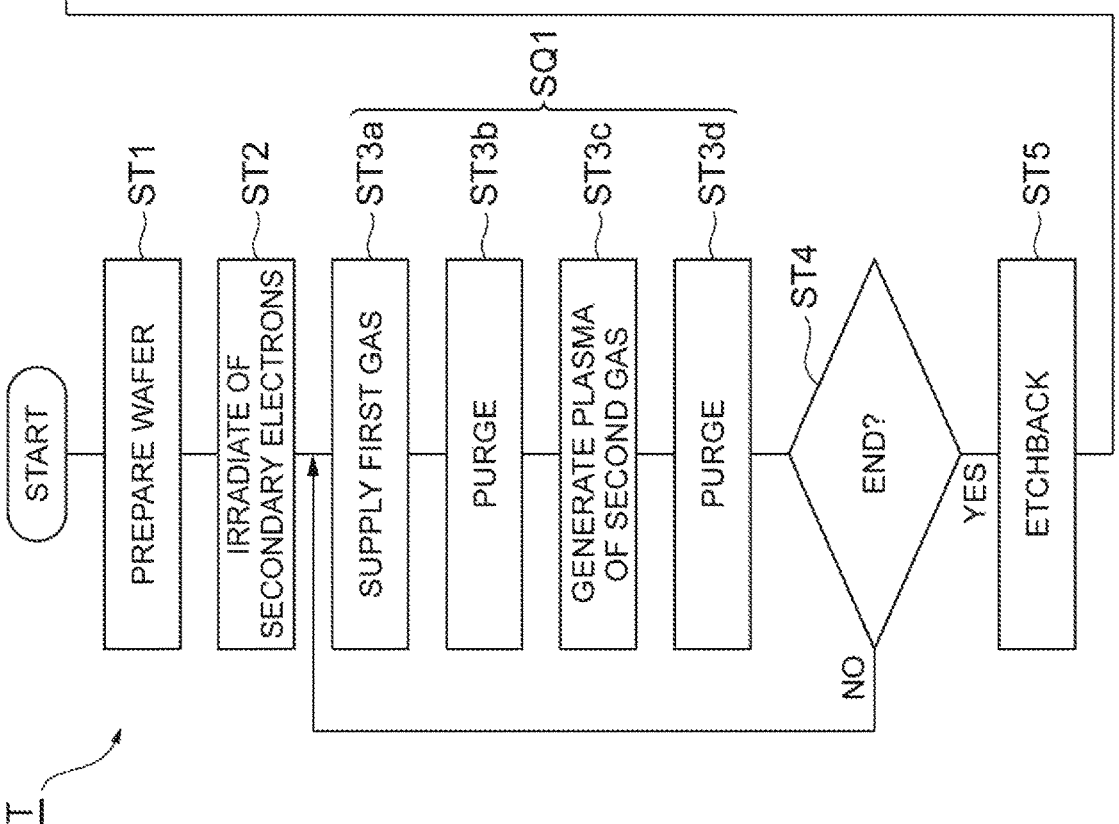

Fig.3
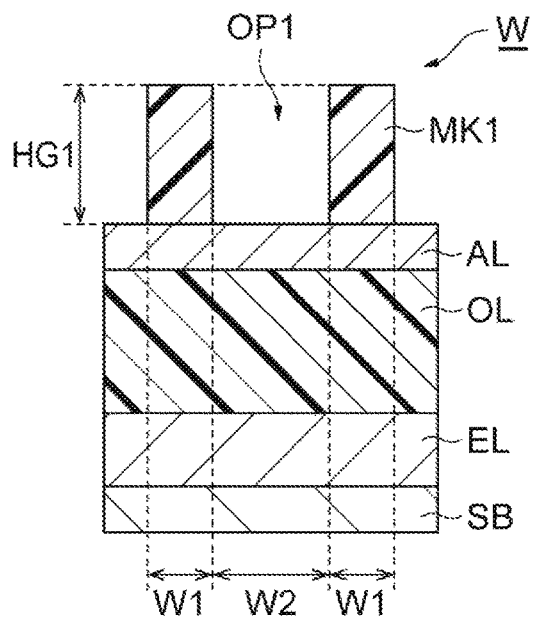
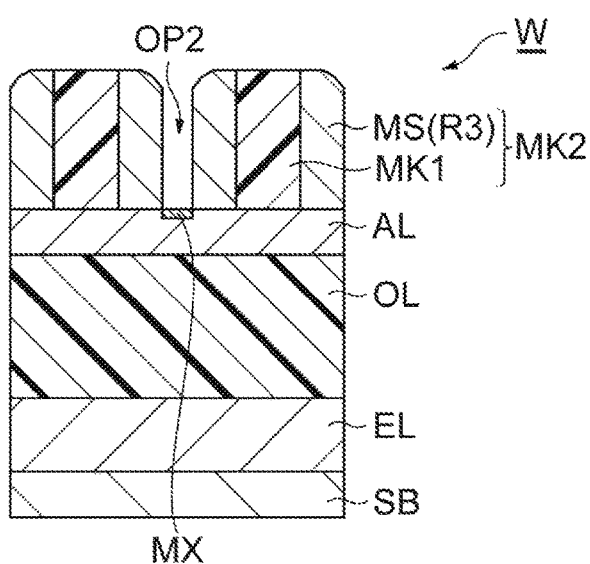
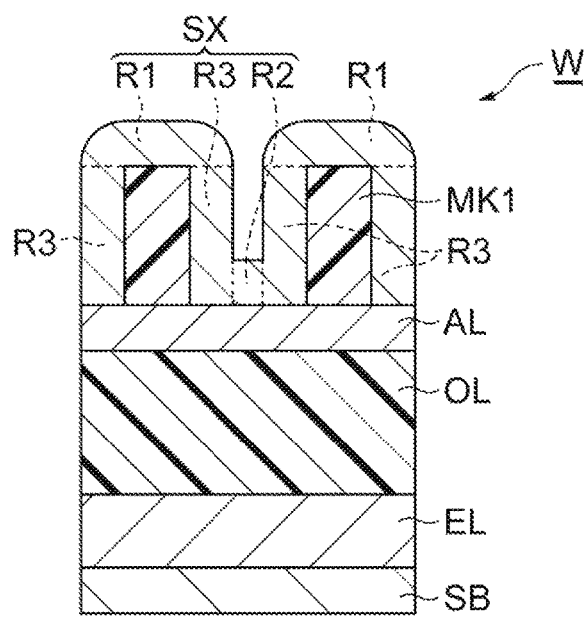

Fig.4
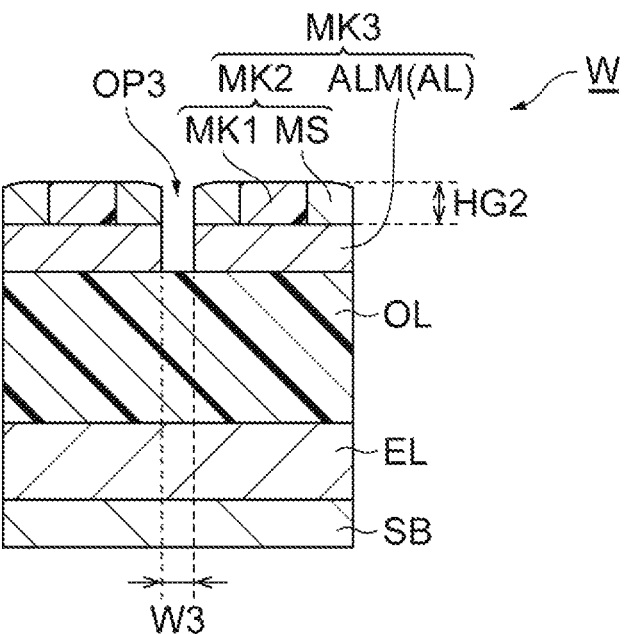
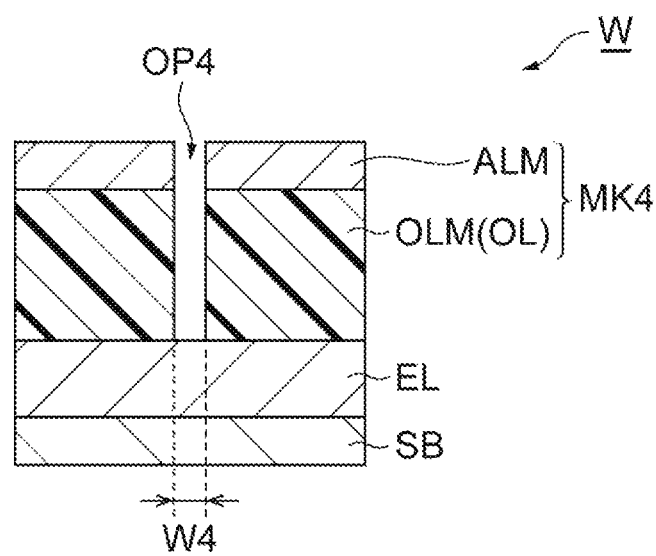

*Fig.5*
(a)
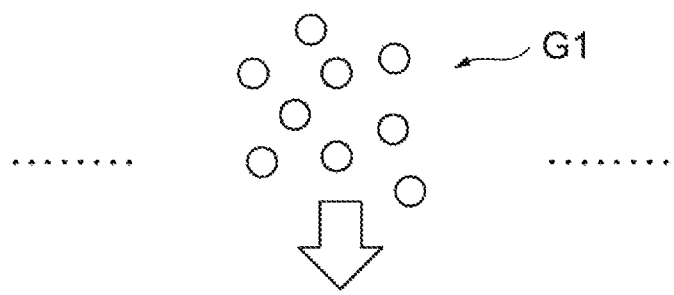
(b)
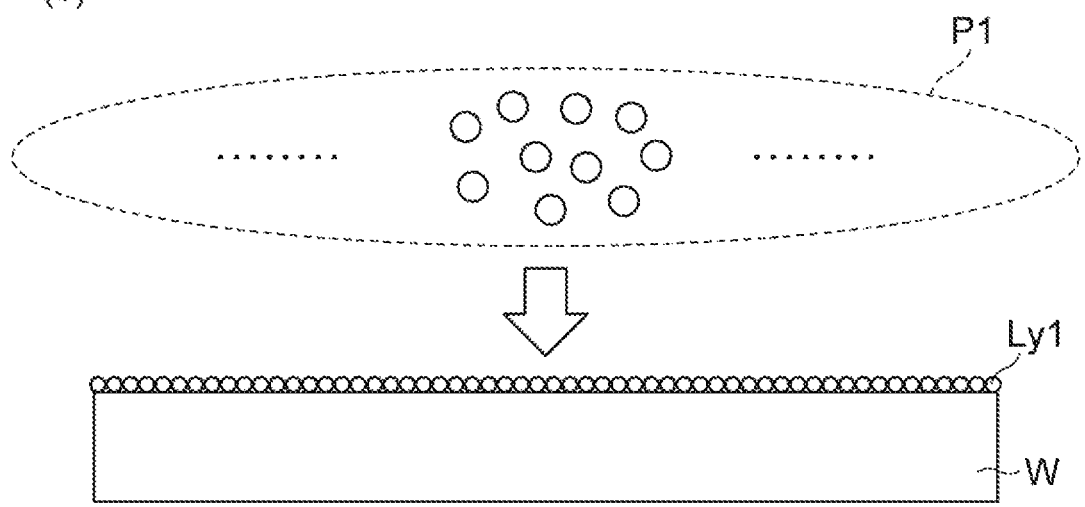
(c)
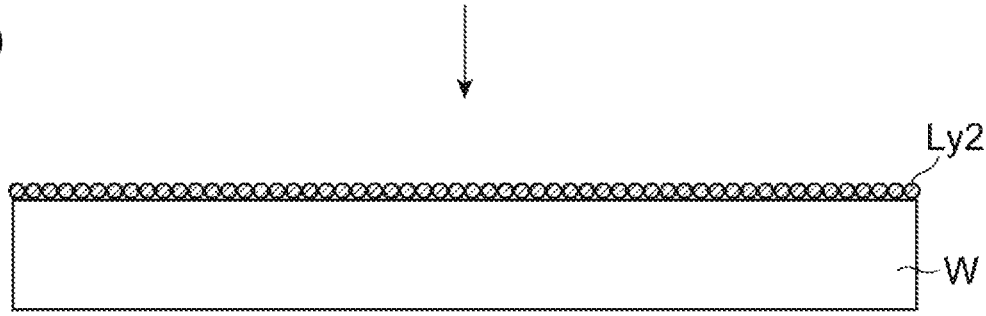

Fig.6
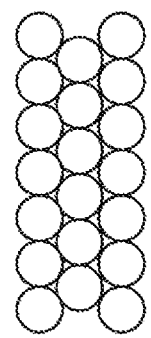
(c)
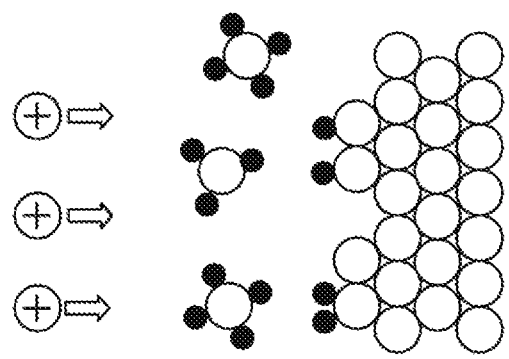
(b)
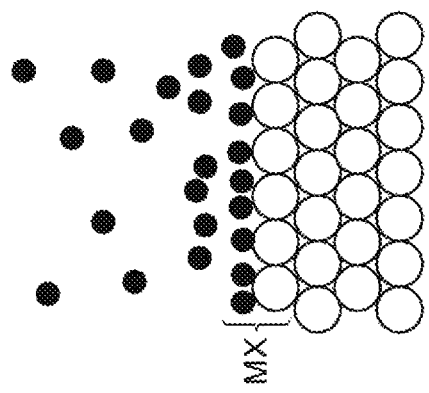
(a)

METHOD FOR PROCESSING WORKPIECE

TECHNICAL FIELD

Embodiments of the present invention relate to a method for processing a workpiece, and more particularly to a method including generation of a mask.

BACKGROUND ART

As semiconductors are miniaturized, in the next-generation lithography technique, extreme ultra-violet (EUV) light is used, which has a wavelength of 13.5 [nm] that is one digit shorter than ArF excimer laser light (wavelength: 193 [nm]) that is currently used for manufacturing a state-of-the-art device. Since absorption of light is increased as the wavelength becomes shorter and an aspect ratio of the resist pattern is made large and pattern collapse tends to occur because the width of the resist pattern is made very small in the generation using EUV lithography, the film thickness of a resist for EUV lithography is reduced. Specifically, an aspect ratio of about 3 or less with respect to the resist pattern width is set to a practical level. That is, in the case of EUV processing the resist film which is the uppermost layer of the stacked mask, the height of the resist film is about 30 [nm] in the generation with the pattern width of 10 [nm], and the height of the resist film is about 20 [nm] in the generation with the pattern width of 7 [nm].

In recent semiconductor devices, a finer pattern needs to be formed, so the influence of the fluctuation of the line pattern edge shape of the resist on device performance becomes obvious. The roughness of the line pattern edge shape is expressed using line width roughness (LWR: variation in a line width [nm]) and line edge roughness (LER: variation in a position of line edge [nm]) as indices. In a case where LER or LWR which is an index of variation in a mask shape increases, stabilization of a gate leakage current and a threshold voltage is hindered, the gate length is fluctuated, and each transistor performance in the LSI circuit varies.

In a semiconductor integrated circuit, on the same wafer, there are a dense pattern area having a large area density in which a memory, a logic portion, and the like are provided, and a sparse pattern area having a small area density in which a peripheral circuit portion and the like are provided. Therefore, in an etching step for manufacturing such a semiconductor integrated circuit, a control technique for realizing the accuracy of a desired pattern dimension formed by lithography is required, irrespective of the density of a pattern. Techniques related to pattern formation are disclosed in Patent Literatures 1 and 2.

An object of a plasma etching performance enhancing method described in Patent Literature 1 is to provide a method of forming a characteristic portion without bowing in a dielectric layer on a semiconductor wafer, by etching a structure defined by an etch mask using plasma. In the method described in Patent Literature 1, a mask is formed on a dielectric layer, protective silicon-containing coating is formed on an exposed surface of the mask, and the characteristic portion is etched through the mask and the protective silicon-containing coating. Further, in another method, the characteristic portion is partially etched prior to forming the protective silicon-containing coating. In this way, the technique described in Patent Literature 1 is to use plasma to form a protective silicon-containing coating on the resist mask and on the sidewall of the partially etched characteristic portion.

An object of a plasma etching method described in Patent Literature 2 is to provide a plasma etching method capable of suppressing variation in processing dimensions, in a plasma etching method by which plasma etching is performed using an EUV-exposed resist. The method described in Patent Literature 2 is a plasma etching method for plasma etching of a material to be etched, with a multilayer resist having an EUV-exposed resist, an antireflection film, an inorganic film, and an organic film as a mask, and the method includes a first step of depositing a deposited film on a surface of the resist before etching the antireflection film, a second step of etching the deposited film deposited on the antireflection film and the antireflection film using a mixed gas of $Cl_2$ gas, HBr gas and $N_2$ gas after the first step, a third step of etching the inorganic film after the second step, and a fourth step of etching the organic film after the third step. In this way, the technique of Patent Literature 2 is a technique capable of suppressing variation in processing dimensions using an EUV resist, in which a deposited film is deposited on a surface of a resist layer using plasma before etching a material to be etched.

CITATION LIST

Patent Literature

[Patent Literature 1] Japanese Unexamined Patent Publication No. 2008-60566
[Patent Literature 2] Japanese Unexamined Patent Publication No. 2014-107520

SUMMARY OF INVENTION

Technical Problem

The resist for EUV lithography used for forming a highly fine pattern as described above has a film thickness less than half of the film thickness of the ArF resist in the related art due to the limit of lithography. Therefore, in a case of forming such a relatively thin and highly fine mask pattern, in the cure step, the step of etching the antireflection film, and the step of etching the organic film, improvement of a mask selection ratio, suppression of LWR and LER, and suppression of influence due to the density of a pattern (a difference in a pattern shape due to the density of a pattern, and the like) are required.

As a technique for improving a mask selection ratio in the related art, there is a technique of forming a protective film on a mask by using deposition gas during etching of an antireflection film. However, in this case, LWR and LER can increase due to stress caused by polymerization reaction of deposition during etching. Further, since the extent of adhesion of deposits during etching depends on the density of a pattern, the extent of adhesion of deposits becomes nonuniform due to the density of a pattern, so that the influence due to the density of a pattern can increase.

In recent years, a technique for etching an antireflection film by using a method similar to the atomic layer etching (ALE) method has been proposed. In this technique, since the amount of ions and the amount of radicals due to etching are separately and independently controlled, by depositing a deposited film (radical amount) of a thin film thickness (a small amount), the antireflection film etching can be performed by relatively low energy. In this technique, a thin protective film is formed on the resist and the antireflection film is selectively etched, so that the selection ratio of the mask (EUV resist) can be improved. Furthermore, with this technique, since the deposited film is thinned as described above, the influence due to the density of a pattern (such as a difference in pattern shape due to the density of a pattern, or the like) can also be reduced. However, according to this technique, since energy is given to a layer to be etched by collision of ions, in a case where the film thickness of the protective film on the mask is relatively thin, the function of protection by the protective film deteriorates and the LWR and LER can be increased due to resist sputtering.

Further, in the technique described in Patent Literature 1, it is possible to form a protective film of a silicon-containing film using plasma of $SiF_4$ gas and $H_2$ gas. However, according to this technique, when there are sparse and dense areas in the pattern, variation in the amount of film formation may occur depending on the density of a pattern.

Further, in the technique described in Patent Literature 2, it is possible to form a protective film of an organic film using plasma of $CHF_3$ gas and $Cl_2$ gas. However, also in this technique, since a carbon-based polymerized film is formed, particularly when there is sparse and dense areas in the pattern, variation in the amount of protection may occur depending on the density of the pattern.

As described above, when forming a highly detailed mask, it is necessary to realize all of improvement of mask selection ratio, suppression of LWR and LER, and suppression of influence due to the density of a pattern.

Solution to Problem

In an aspect, there is provided a method for processing a workpiece. The workpiece includes a layer to be etched, an organic film provided on the layer to be etched, an antireflection film provided on the organic film, and a first mask provided on the antireflection film. The method includes a step (referred to as step a) of conformally forming a protective film on the surface of the first mask in a processing container of a plasma processing apparatus in which the workpiece is accommodated, and a step (referred to as step b) of etching the antireflection film by removing the antireflection film for each atomic layer with plasma generated in the processing container, using the first mask on which the protective film is formed, after execution of step a.

In this way, by executing step a, a protective film having a conformal film thickness, which is precisely controlled, is formed on the first mask regardless of the density difference of the mask, resistance to etching of a mask is enhanced while the shape of the mask is maintained, and by executing step b, the mask selection ratio is enhanced, and an influence on the mask shape (line width roughness (LWR) and line edge roughness (LER)) by etching is reduced.

One embodiment further includes a step (referred to as step c) of irradiating the first mask with secondary electrons by generating plasma in the processing container and applying a negative DC voltage to the upper electrode of the parallel plate electrode provided in the processing container, before execution of step a. In this way, since the first mask is irradiated with the secondary electrons before executing step a of forming the protective film, the first mask can be modified before the formation of the protective film, and the damage of the first mask in the subsequent steps can be suppressed.

In one embodiment, an electrode plate of the upper electrode contains silicon, and in step c, by generating plasma in the processing container to apply a negative DC voltage to the upper electrode, silicon is released from the electrode plate and the first mask is covered with silicon oxide compound containing silicon. In this way, in step c, the first mask is covered with the silicon oxide compound, so that the damage of the first mask in the subsequent steps can be further suppressed.

In one embodiment, in step a, a protective film is conformally formed on the surface of the first mask, by repeating a first sequence including a first step of supplying a first gas into the processing container, a second step of purging the space inside the processing container after execution of the first step, a third step of generating plasma of a second gas in the processing container after execution of the second step, and a fourth step of purging the space inside the processing container after execution of the third step, and in the first step, plasma of the first gas is not generated. In this way, in step a, a protective film is conformally Rallied on the silicon compound on the surface of the first mask by the same method as the atomic layer deposition (ALD) method, so that the protection against the mask is enhanced, and a protective film that protects the mask can be formed with a uniform film thickness.

In one embodiment, the first gas includes an organic-containing aminosilane-based gas. In this way, since the first gas includes the organic-containing aminosilane-based gas, in the first step, a silicon reaction precursor is formed on the first mask along the atomic layer of the surface of the first mask.

In one embodiment, the aminosilane-based gas of the first gas may include aminosilane having one to three silicon atoms. The aminosilane-based gas of the first gas may include aminosilane with one to three amino groups. In this way, aminosilane containing one to three silicon atoms can be used for aminosilane-based gas of the first gas. Further, aminosilane containing one to three amino groups can be used for aminosilane-based gas of the first gas.

In one embodiment, the second gas includes gas containing oxygen atoms and carbon atoms. In this way, since the second gas includes oxygen atoms, in the third step, the oxygen atom bonds with the silicon reaction precursor provided on the first mask, so that the protective film of silicon oxide can be formed conformally on the first mask. Further, since the second gas includes carbon atoms, erosion by oxygen atoms against the first mask can be suppressed by the carbon atoms.

In an embodiment, in step b, the antireflection film is etched by removing the antireflection film for each atomic layer, by repeating a second sequence including a fifth step of generating plasma of a third gas in the processing container and forming a mixed layer including radicals contained in the plasma on the atomic layer of the surface of the antireflection film, after execution of step a, a sixth step of purging the space inside the processing container, after execution of the fifth step, a seventh step of generating plasma of a fourth gas in the processing container and applying a bias voltage to the plasma to remove the mixed layer, after execution of the sixth step, and an eighth step of purging the space inside the processing container, after execution of the seventh step. In this way, in step b, it is possible to remove the antireflection film for each atomic layer by the same method as the atomic layer etching (ALE) method.

In one embodiment, the third gas includes fluorocarbon-based gas and rare gas. In this way, since the third gas includes fluorocarbon-based gas, in a fifth step, fluorine radicals and carbon radicals are supplied to the atomic layer of the surface of the antireflection film, and a mixed layer including both radicals can be formed in the atomic layer of the surface.

In one embodiment, the fourth gas includes rare gas. In this way, since the fourth gas includes rare gas, in a seventh step, the mixed layer formed in the surface of an antireflection film can be removed from the surface, by energy received by plasma of the rare gas by a bias voltage.

In an embodiment, a step of performing an etching process on the organic film using a second mask, with plasma generated in the processing container, after execution of step b is further included, in step b, the second mask is formed from the antireflection film. In this way, by executing steps a and b, a mask whose shape is maintained and selection ratio is improved is formed on the organic film regardless of the density of the mask, so that the etching of the organic film by using the mask of such a good shape is possible and the organic film can be etched well.

Advantageous Effects of Invention

As described above, when forming a highly detailed mask, it is possible to realize all of improvement of mask selection ratio, suppression of LWR and LER, and suppression of influence due to the density of a pattern.

BRIEF DESCRIPTION OF DRAWINGS

FIG. 1 is a flowchart illustrating a method of an embodiment.

FIG. 3 is a cross-sectional view illustrating the state of a workpiece before and after execution of each step shown in FIG. 1, including parts (a), (b) and (c).

FIG. 4 is a cross-sectional view illustrating the state of the workpiece after execution of each step shown in FIG. 1, including parts (a) and (b).

FIG. 5 is a diagram schematically illustrating a state in which a protective film is formed in a sequence of forming the protective film shown in FIG. 1.

FIG. 6 is a diagram illustrating the principle of etching in the method illustrated in FIG. 1.

DESCRIPTION OF EMBODIMENTS

Figure 2:
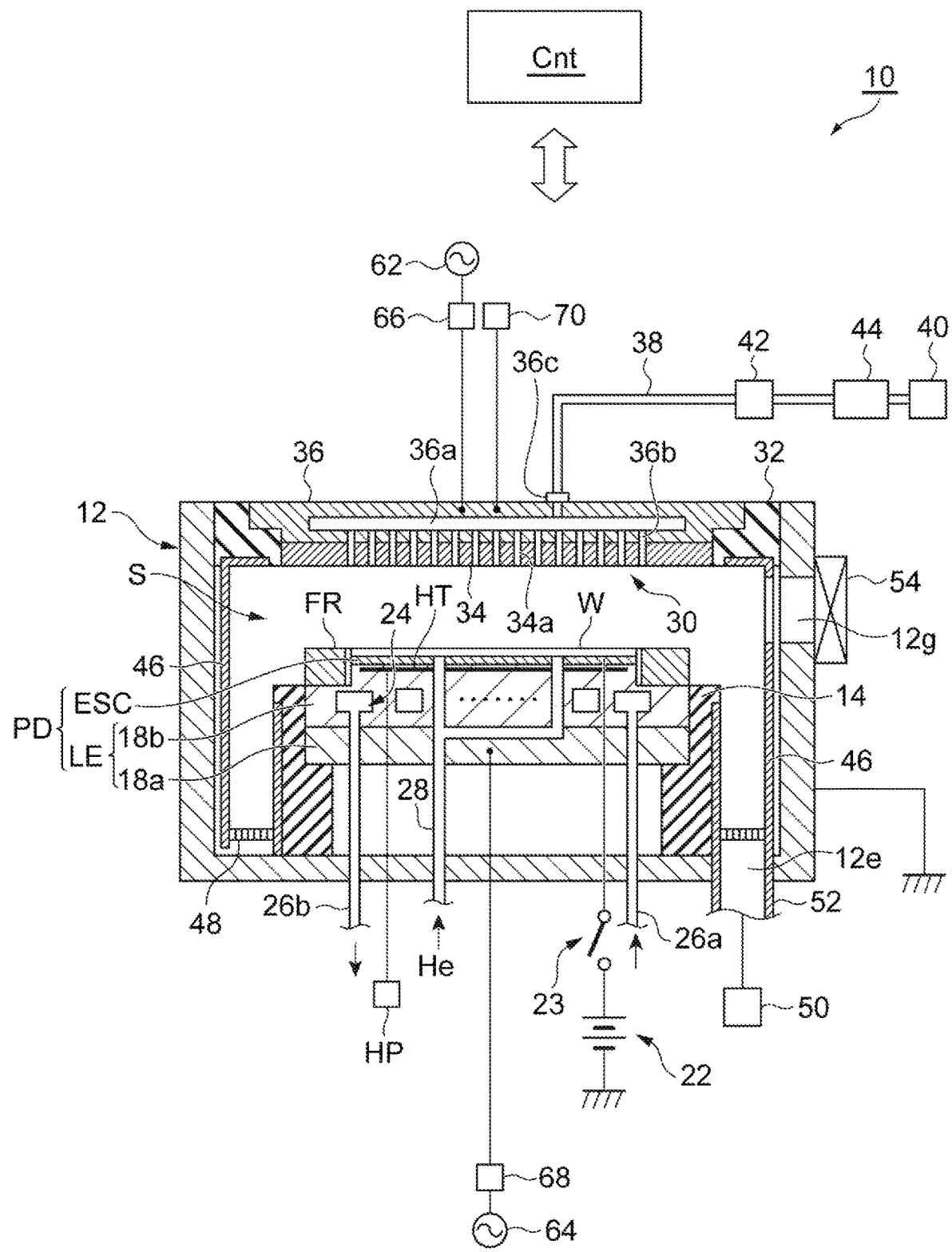
FIG. 2 is a diagram illustrating an example of a plasma processing apparatus.

Hereinafter, various embodiments will be described in detail with reference to the accompanying drawings. The same or equivalent parts in the drawings are denoted by the same reference numerals.

An etching method (method MT) which can be performed by using the plasma processing apparatus 10 will be described below with reference to FIG. 1. FIG. 1 is a flowchart illustrating a method of an embodiment. A method MT of an embodiment illustrated in FIG. 1 is a method of processing a workpiece (hereinafter, it may be referred to as "wafer" in some cases). The method MT is a method of etching the wafer. In the method MT of an embodiment, it is possible to execute a series of steps using a single plasma processing apparatus.

FIG. 2 is a diagram illustrating an example of a plasma processing apparatus. FIG. 2 schematically illustrates a cross-sectional structure of a plasma processing apparatus 10 that can be used in various embodiments of a method for processing the workpiece. As illustrated in FIG. 2, the plasma processing apparatus 10 is a plasma etching apparatus provided with electrodes of parallel flat plates, and it includes a processing container 12. The processing container 12 has a substantially cylindrical shape. The processing container 12 is made of, for example, aluminum, and its inner wall surface is subjected to anodic oxidation treatment. The processing container 12 is securely grounded.

A substantially cylindrical support portion 14 is provided on the bottom portion of the processing container 12. The support portion 14 is made of, for example, an insulating material. The insulating material constituting the support portion 14 may contain oxygen like quartz. The support portion 14 extends in the vertical direction from the bottom portion of the processing container 12, in the processing container 12. A placement table PD is provided in the processing container 12. The placement table PD is supported by the support portion 14.

The placement table PD supports a wafer W on the upper surface of the placement table PD. The placement table PD has a lower electrode LE and an electrostatic chuck ESC. The lower electrode LE includes a first plate 18a and a second plate 18b. The first plate 18a and the second plate 18b are made of metal such as aluminum, for example, and have a substantially disc shape. The second plate 18b is provided on the first plate 18a and is electrically connected to the first plate 18a.

On the second plate 18b, an electrostatic chuck ESC is provided. The electrostatic chuck ESC has a structure in which an electrode which is a conductive film is disposed between a pair of insulating layers or between a pair of insulating sheets. A DC power supply 22 is electrically connected to the electrode of the electrostatic chuck ESC through a switch 23. The electrostatic chuck ESC attracts the wafer W by an electrostatic force such as a Coulomb force generated by a DC voltage from the DC power supply 22. Thus, the electrostatic chuck ESC can hold the wafer W.

On the peripheral portion of the second plate 18b, a focus ring FR is disposed to surround the edge of the wafer W and the electrostatic chuck ESC. The focus ring FR is provided to improve etching uniformity. The focus ring FR is made of a material appropriately selected depending on the material of the film to be etched, and can be made of, for example, quartz.

Inside the second plate 18b, a coolant flow path 24 is provided. The coolant flow path 24 constitutes a temperature control mechanism. Coolant is supplied to the coolant flow path 24 from a chiller unit (not shown) provided outside the processing container 12 through a pipe 26a. The coolant supplied to the coolant flow path 24 is returned to the chiller unit through the pipe 26b. In this way, the coolant is supplied to the coolant flow path 24 so as to circulate. By controlling the temperature of the coolant, the temperature of the wafer W supported by the electrostatic chuck ESC is controlled.

The plasma processing apparatus 10 is provided with a gas supply line 28. The gas supply line 28 supplies heat transfer gas, for example He gas, from the heat transfer gas supply mechanism to between the upper surface of the electrostatic chuck ESC and the back surface of the wafer W.

In the plasma processing apparatus 10, a heater HT as a heating element is provided. For example, the heater HT is embedded in the second plate 18b. A heater power supply HP is connected to the heater HT. By supplying power from the heater power supply HP to the heater HT, the temperature of the placement table PD is adjusted, and the temperature of the wafer W placed on the placement table PD is adjusted. The heater HT may be incorporated in the electrostatic chuck ESC.

The plasma processing apparatus 10 includes an upper electrode 30. The upper electrode 30 is disposed to face the placement table PD, above the placement table PD. The lower electrode LE and the upper electrode 30 are provided in substantially parallel to each other to constitute the parallel plate electrodes. Between the upper electrode 30 and the lower electrode LE, a processing space S for performing a plasma process on the wafer W is provided.

The upper electrode 30 is supported on the upper part of the processing container 12 through an insulating shielding member 32. The insulating shielding member 32 is made of an insulating material, and contains oxygen, such as quartz, for example. The upper electrode 30 may include an electrode plate 34 and an electrode support 36. The electrode plate 34 faces the processing space S, and the electrode plate 34 is provided with a plurality of gas discharge holes 34a. The electrode plate 34 contains silicon in an embodiment. In another embodiment, the electrode plate 34 may contain silicon oxide.

The electrode support 36 detachably supports the electrode plate 34, and can be made of a conductive material such as aluminum, for example. The electrode support 36 may have a water cooling structure. Inside the electrode support 36, a gas diffusion chamber 36a is provided. A plurality of gas flow holes 36b communicating with the gas discharge holes 34a extend downward from the gas diffusion chamber 36a. A gas inlet 36c for guiding the processing gas to the gas diffusion chamber 36a is formed in the electrode support 36, and a gas supply pipe 38 is connected to the gas inlet 36c.

A gas source group 40 is connected to the gas supply pipe 38, through a valve group 42 and a flow rate controller group 44. The gas source group 40 has a plurality of gas sources. The plurality of gas sources are a source of an organic-containing aminosilane-based gas, a source of a fluorocarbon-based gas ($C_xF_y$ gas (x and y are integers of 1 to 10)), a source of a gas having oxygen atoms and carbon atoms (for example, carbon dioxide gas, or the like), a source of nitrogen gas, a source of hydrogen containing gas, and a source of rare gas. As the fluorocarbon-based gas, any fluorocarbon-based gas such as $CF_4$ gas, $C_4F_6$ gas, and $C_4F_8$ gas can be used. As the aminosilane-based gas, one having a molecular structure with a relatively small number of amino groups can be used. For example, mono aminosilane ($H_3$—Si—R (R is an amino group that contains organic matter and may be substituted)) can be used. Further, the above-mentioned aminosilane-based gas (gas contained in a first gas G1 to be described later) can contain aminosilane which may have one to three silicon atoms, or can contain aminosilane having one to three amino groups. Aminosilane having one to three silicon atoms may be monosilane (mono aminosilane) having one to three amino groups, disilane having one to three amino groups, or trisilane having one to three amino groups. Furthermore, the above-mentioned aminosilane may have an amino group which may be substituted. Further, the above-mentioned amino group can be substituted by any one of a methyl group, an ethyl group, a propyl group, and a butyl group. Further, the methyl group, the ethyl group, the propyl group, and the butyl group, which are mentioned above, can be substituted by halogen. As the rare gas, any rare gas such as Ar gas and He gas may be used.

The valve group 42 includes a plurality of valves, and the flow rate controller group 44 includes a plurality of flow rate controllers such as a mass flow controller. Each of the plurality of gas sources of the gas source group 40 is connected to a gas supply pipe 38 through the corresponding valve of the valve group 42 and the corresponding flow rate controller of the flow rate controller group 44. Therefore, the plasma processing apparatus 10 can supply gas from one or more gas sources selected from among the plurality of gas sources of the gas source group 40 into the processing container 12 at individually adjusted flow rates.

In the plasma processing apparatus 10, a deposit shield 46 is detachably provided along the inner wall of the processing container 12. The deposit shield 46 is also provided on the outer periphery of the support portion 14. The deposit shield 46 prevents etching by-products (deposits) from adhering to the processing container 12, and can be made by coating an aluminum material with ceramics such as $Y_2O_3$. In addition to $Y_2O_3$, the deposit shield can be made of a material containing oxygen such as quartz, for example.

An exhaust plate 48 is provided on the bottom side of the processing container 12 and between the support portion 14 and the side wall of the processing container 12. The exhaust plate 48 can be made, for example, by covering an aluminum material with ceramics such as $Y_2O_3$. An exhaust port 12e is provided under the exhaust plate 48 and in the processing container 12. An exhaust device 50 is connected to the exhaust port 12e through an exhaust pipe 52. The exhaust device 50 includes a vacuum pump such as a turbo molecular pump, and can depressurize the space inside the processing container 12 to a predetermined degree of vacuum. A loading/unloading port 12g for the wafer W is provided on a side wall of the processing container 12, and the loading/unloading port 12g can be opened and closed by a gate valve 54.

The plasma processing apparatus 10 further includes a first radio-frequency power supply 62 and a second radio-frequency power supply 64. The first radio-frequency power supply 62 is a power supply that generates a first radio-frequency power for plasma generation, and generates radio-frequency power of a frequency of 27 to 100 [MHz], in an example, 60 [MHz]. In addition, the first radio-frequency power supply 62 has a pulse specification and can be controlled with a frequency of 5 to 10 [kHz] and a duty ratio of 50 to 100%. The first radio-frequency power supply 62 is connected to the upper electrode 30 through a matching unit 66. The matching unit 66 is a circuit that matches the output impedance of the first radio-frequency power supply 62 and the input impedance on the load side (lower electrode LE side). In addition, the first radio-frequency power supply 62 may be connected to the lower electrode LE through the matching unit 66.

The second radio-frequency power supply 64 is a power supply that generates second radio-frequency power for attracting ions to the wafer W, that is, radio-frequency bias power, and generates a frequency within the range of 400 [kHz] to 40.68 [MHz], in an example, radio-frequency bias power with a frequency of 13.56 [MHz]. In addition, the second radio-frequency power supply 64 has a pulse specification and can be controlled with a frequency of 5 to 40 [kHz] and a duty ratio of 20 to 100%. The second radio-frequency power supply 64 is connected to the lower electrode LE through the matching unit 68. The matching unit 68 is a circuit that matches the output impedance of the second radio-frequency power supply 64 and the input impedance on the load side (lower electrode LE side).

The plasma processing apparatus 10 further includes a power supply 70. The power supply 70 is connected to the upper electrode 30. The power supply 70 applies to the upper electrode 30, a voltage for attracting positive ions present in the processing space S to the electrode plate 34. In an example, the power supply 70 is a DC power supply that generates a negative DC voltage. When such a voltage is applied from the power supply 70 to the upper electrode 30, the positive ions present in the processing space S collide with the electrode plate 34. Thus, secondary electrons and/or silicon is released from the electrode plate 34.

In an embodiment, the plasma processing apparatus 10 may further include a control unit Cnt. The control unit Cnt is a computer including a processor, a storage unit, an input device, a display device, and the like, and controls each unit of the plasma processing apparatus 10. Specifically, the control unit Cnt is connected to the valve group 42, the flow rate controller group 44, the exhaust device 50, the first radio-frequency power supply 62, the matching unit 66, the second radio-frequency power supply 64, the matching unit 68, the power supply 70, the heater power supply HP, and the chiller unit.

The control unit Cnt operates according to a program based on the input recipe and sends out a control signal. It is possible to control the selection and flow rate of gas selected from the gas source group 40, the exhaust by the exhaust device 50, the supply of power from the first radio-frequency power supply 62 and the second radio-frequency power supply 64, the voltage application from the power supply 70, the power supply from the heater power supply HP, the coolant flow rate and coolant temperature from the chiller unit, according to the control signal from the control unit Cnt. Each step of the method MT for processing the workpiece in this specification can be executed by operating each unit of the plasma processing apparatus 10 under the control by the control unit Cnt.

With reference to a part (a) of FIG. 3, the main configuration of a wafer W prepared in step ST1 of method MT illustrated in FIG. 1 will be explained. FIG. 3 is a cross-sectional view illustrating the state of the workpiece before and after execution of each step shown in FIG. 1.

As illustrated in part (a) of FIG. 3, the wafer W prepared in step ST1 includes a substrate SB, a layer EL to be etched, an organic film OL, an antireflection film AL, and a mask MK1 (first mask). The layer EL to be etched is provided on the substrate SB. The layer EL to be etched is a layer made of a material which is selectively etched with respect to the organic film OL, and an insulating film is used. The layer EL to be etched is made of, for example, silicon oxide ($SiO_2$). Further, the layer EL to be etched can be made of other materials such as polycrystalline silicon.

The organic film OL is provided on the layer EL to be etched. The organic film OL is a layer including carbon, for example, a spin-on hard mask (SOH) layer. The antireflection film AL is a silicon-containing antireflection film and is provided on the organic film OL.

The mask MK1 is provided on the antireflection film AL. The mask MK1 is a resist mask made of a resist material, and is manufactured by patterning a resist layer by a photolithography technique. The mask MK1 is, for example, an ArF resist. The mask MK1 covers partially the antireflection film AL. The mask MK1 defines an opening OP1 partially exposing the antireflection film AL. The pattern of the mask MK 1 is, for example, a line and space pattern, but can have patterns of various other shapes such as a pattern that provides a circular opening in planar view and a pattern that provides an opening of an elliptical shape in planar view. The mask MK1 on the antireflection film AL has a height of a value of HG1 [nm]. Hereinafter, in a case where the ratio between the width (W1 [nm]) of the mask MK1 and the width (W2 [nm]) of the opening OP1 provided by the mask MK1 is about 1:1, the mask may be said to be "dense" (wafer (dense)), and in a case of about 1:5, the mask may be said to be "sparse" (wafer (sparse)).

Returning to FIG. 1, the description of the method MT will be continued. In the following description, description will be made with reference to FIG. 3, FIG. 4, and FIG. 5 together with FIG. 1. FIG. 3 is a cross-sectional view illustrating the state of the workpiece before and after execution of each step shown in FIG. 1. FIG. 4 is a cross-sectional view illustrating the state of the workpiece after execution of each step of the method shown in FIG. 1. FIG. 5 is a diagram schematically illustrating a state in which a protective film is formed in a sequence of forming the protective film shown in FIG. 1.

In step ST1, a wafer W illustrated in the part (a) of FIG. 3 is prepared, and the wafer W is accommodated in the processing container 12 of the plasma processing apparatus 10 and placed on the electrostatic chuck ESC. In step ST1, the wafer W shown in part (a) of FIG. 3 is prepared as the wafer W shown in FIG. 2, and then step ST2 and subsequent steps are executed.

In step ST2 subsequent to step ST1, the wafer W is irradiated with secondary electrons. Step ST2 is a step of irradiating the mask MK1 with secondary electrons by generating plasma in the processing container 12 and applying a negative DC voltage to the upper electrode 30, before executing a sequence SQ1 which conformally forms a protective film (protective film SX) of silicon oxide in the mask MK1 and step ST4.

As described above, since the mask MK1 is irradiated with secondary electrons before execution of a series of steps of sequence SQ1 to step ST4 forming the protective film SX, the mask MK1 can be modified before the formation of the protective film SX and the damage of the first mask MK1 in the subsequent steps can be suppressed.

The processing contents of step ST2 will be described in detail. First, hydrogen gas and rare gas are supplied into the processing container 12, and radio-frequency power is supplied from the first radio-frequency power supply 62, whereby plasma is generated in the processing container 12. Hydrogen gas and rare gas from the gas source selected from among a plurality of gas sources of the gas source group 40 are supplied into the processing container 12. Accordingly, positive ions in the processing space S are drawn into the upper electrode 30, and the positive ions collide with the upper electrode 30. As positive ions collide with the upper electrode 30, secondary electrons are released from the upper electrode 30. By irradiating the wafer W with the released secondary electrons, the mask MK1 is modified. Further, as positive ions collide with the electrode plate 34, silicon as a constituent material of the electrode plate 34 is released together with the secondary electrons. The released silicon combines with oxygen released from the components of the plasma processing apparatus 10 exposed to the plasma. The oxygen is released from, for example, members such as the support portion 14, the insulating shielding member 32, and the deposit shield 46. The combination of silicon and oxygen produces a silicon oxide compound and the silicon oxide compound is deposited on the wafer W to cover and protect the mask MK1. In this way, in step ST2 of irradiating the mask MK1 with secondary electrons, by generating plasma in the processing container 12 to apply a negative DC voltage to the upper electrode 30, the mask MKT is irradiated with secondary electrons and silicon is released from the electrode plate 34 to cover the mask MK1 with silicon oxide compound containing silicon. Then, after the mask MKT is irradiated with secondary electrons to cover the mask MK1 with silicon oxide compound, the space inside the processing container 12 is purged, and the process proceeds to step ST2a.

As described above, in step ST2, the mask MK1 is covered with the silicon oxide compound, so that the damage of the mask MK1 in the subsequent steps can be further suppressed.

In step ST2, the release of silicon may be suppressed by minimizing the bias power of the second radio-frequency power supply 64 in order to modification by the secondary electrons and form a protective film. It is also possible to exclude step ST2 in method MT.

Subsequent to step ST2, sequence SQ1, step ST5, sequence SQ2, step ST7 (sequence SQ1 to step ST7) are sequentially executed. A series of steps of sequence SQ1 to step ST5 is a step of conformally forming a protective film SX of silicon oxide on the surface of mask MK1, and a series of steps of sequence SQ2 to step ST7 is a step of precisely etching the antireflection film AL by removing the antireflection film AL for each atomic layer by using the mask MK1 on which the protective film SX of the silicon oxide film is formed, after execution of the series of steps of sequence SQ1 to step ST5. In this way, by executing a series of steps of sequence SQ1 to step ST5, a protective film SX having a conformal film thickness, which is precisely controlled, is formed on the mask regardless of the density difference of the mask, resistance to the etching of the mask is enhanced while maintaining the shape of mask, and by executing a series of steps of sequence SQ2 to step ST7, the mask selection ratio is enhanced, and an influence on the mask shape (line width roughness (LWR) and line edge roughness (LER)) by etching is reduced.

Subsequent to step ST2, sequence SQ1 (first sequence) is executed once (unit cycle) or more. Sequence SQ1 and step ST4 are a step of conformally forming a protective film SX of silicon oxide with a uniform thickness on the wafer W by the same method as the atomic layer deposition (ALD) method, and includes step ST3a (first step), step ST3b (second step), step ST3c (third step), and step ST3d (fourth step) which are executed sequentially in sequence SQL In step ST3a, the first gas G1 is supplied into the processing container 12. Specifically, in step ST3a, as illustrated in a part (a) of FIG. 5, a first gas G1 containing silicon is introduced into the processing container 12. The first gas G1 includes an organic-containing aminosilane-based gas. The first gas G1 of an organic-containing aminosilane-based gas is supplied from the gas source selected from among a plurality of gas sources of the gas source group 40 into the processing container 12. For the first gas G1, as aminosilane-based gas, for example, mono aminosilane ($H_3$—Si—R (R is an organic-containing amino group)) is used. In step ST3a, plasma of the first gas G1 is not generated.

The molecules of the first gas G1 adhere to the surface of the wafer W as a reaction precursor (layer Ly1), as shown in part (b) of FIG. 5. The first gas G1 molecule (mono aminosilane) adheres to the surface of the wafer W by chemical adsorption based on chemical bonds, and plasma is not used. In step ST3a, the temperature of the wafer W is about 0 degrees Celsius or more, and about the glass transition temperature of the material contained in the mask MK1 or less (for example, 200 degrees Celsius or less). It is also possible to use gases other than mono aminosilane as long as they can adhere to the surface by chemical bonds in the temperature range and contain silicon.

The reason why the mono aminosilane is selected for the first gas G1 is that the mono aminosilane has a molecular structure having a relatively high electronegativity and polarity, which allows chemisorption to be performed comparatively easily. The layer Ly1 of the reaction precursor formed by the adhesion of the first gas G1 molecule to the surface of the wafer W is in a state close to a monomolecular layer (monolayer) because the adhesion is chemical adsorption. The smaller the amino group (R) of the mono aminosilane, the smaller the molecular structure of the molecule adsorbed on the surface of the wafer W, so that the steric effects due to the size of the molecule is reduced. Therefore, the molecule of the first gas G1 can be uniformly adsorbed on the surface of the wafer W, and the layer Ly1 can be formed with a uniform film thickness on the surface of the wafer W. The layer Ly 1 can be conformally formed with a uniform film thickness on the surface of the wafer W, without depending on the pattern density of the wafer W.

As described above, since the first gas G1 includes an organic-containing aminosilane-based gas, in step ST3a, a silicon reaction precursor (layer Ly1) is formed on the mask MK1 along the atomic layer of the surface of the mask MK1.

In step ST3b subsequent to step ST3a, the space inside the processing container 12 is purged. Specifically, the first gas G1 supplied in step ST3a is exhausted. In step ST3b, as the purge gas, an inert gas such as nitrogen gas or rare gas (for example, Ar or the like) gas may be supplied to the processing container 12. That is, the purging in step ST3b may be any one of gas purging to flow inert gas into the processing container 12, or purging by evacuating. In step ST3b, molecules excessively attached on the wafer W can also be removed. Thus, the layer Ly1 of the reaction precursor becomes an extremely thin monomolecular layer.

In step ST3c subsequent to step ST3b, as shown in part (b) of FIG. 5, plasma P1 of the second gas is generated in the processing container 12. The second gas includes gas containing oxygen atoms and carbon atoms, and may include, for example, carbon dioxide gas. In step ST3c, the temperature of the wafer W when the plasma P1 of the second gas is generated is about 0 degrees Celsius or more, and about the glass transition temperature of the material contained in the mask MK1 or less (for example, 200 degrees Celsius or less). The second gas including gas containing oxygen atoms and carbon atoms from the gas source selected from among a plurality of gas sources of the gas source group 40 is supplied into the processing container 12. Then, radio-frequency power is supplied from the first radio-frequency power supply 62. In this case, bias power of the second radio-frequency power supply 64 can be applied. It is also possible to generate plasma using only the second radio-frequency power supply 64 without using the first radio-frequency power supply 62. The pressure in the space inside the processing container 12 is set to a preset pressure by operating the exhaust device 50. In this way, the plasma P1 of the second gas is generated in the processing container 12.

As shown in part (b) of FIG. 5, when the plasma P1 of the second gas is generated, an active species of oxygen and an active species of carbon, for example, an oxygen radical and a carbon radical are generated, and as shown in part (c) of FIG. 5, a layer Ly2 (corresponding to a protective film SX) which is a silicon oxide film is formed as a monomolecular layer. Since carbon radicals can have a function of suppressing oxygen erosion to the mask MK1, a silicon oxide film can be stably formed on the surface of the mask MK1 as a protective film. Since the binding energy of the Si—O bond of the silicon oxide film is about 192 [kcal], and is higher than the binding energy (about 50 to 110 [kcal], about 70 to 110 [kcal]e, about 100 to 120 [kcal]) of the C—C bond, C—H bond, C—F bond, respectively, which are various bonding species of the organic film forming the mask, the silicon oxide film can function as a protective film.

As described above, since the second gas includes oxygen atoms, in step ST3c, the oxygen atom bonds with the silicon reaction precursor (layer Ly1) provided on the mask MK1, so that the layer Ly2 of a silicon oxide film can be formed conformally on the mask MK1. Further, since the second gas includes carbon atoms, erosion by oxygen atoms against the mask MK1 can be suppressed by the carbon atoms. Therefore, in sequence SQ1, as in the ALD method, by executing sequence SQ1 once (unit cycle), the layer Ly2 of the silicon oxide film can be formed conformally with a thin and uniform film thickness on the surface of the wafer W, regardless of the density of the mask MK1.

In step ST3d subsequent to step ST3c, the space inside the processing container 12 is purged. Specifically, the second gas supplied in step ST3c is exhausted. In step ST3d, as the purge gas, an inert gas such as nitrogen gas or rare gas (for example, Ar or the like) may be supplied to the processing container 12. That is, the purging in step ST3d may be any one of gas purging to flow inert gas into the processing container 12, or purging by evacuating.

In step ST4 subsequent to sequence SQ1, it is determined whether or not to end the execution of sequence SQL Specifically, in step ST4, it is determined whether or not the number of executions of sequence SQ1 has reached the preset number. Determination of the number of executions of sequence SQ1 is to determine the thickness of the film of the protective film SX formed on the wafer W shown in part (b) of FIG. 3. That is, the film thickness of the protective film SX finally formed on the wafer W can be substantially determined by the product of the film thickness of the silicon oxide film formed by executing sequence SQ1 once (unit cycle) and the number of executions of sequence SQL Therefore, the number of executions of sequence SQ1 can be set according to the desired thickness of the protective film SX formed on the wafer W. In this way, by repeating sequence SQ1, the protective film SX of the silicon oxide film is conformally formed on the surface of the mask MK1.

In a case where it is determined in step ST4 that the number of executions of sequence SQ1 has not reached the preset number (step ST4: NO), the execution of sequence SQ1 is repeated again. On the other hand, in a case where it is determined in step ST4 that the number of executions of sequence SQ1 has reached the preset number (step ST4: YES), the execution of sequence SQ1 is ended. Thus, as illustrated in part (b) of FIG. 3, a protective film SX which is a silicon oxide film is formed on the surface of the wafer W. That is, by repeating sequence SQ1 by a preset number of times, a protective film SX having a preset film thickness is conformally formed on the surface of the wafer W with a uniform film thickness, regardless of the density of the mask MK1. The thickness of the film of the protective film SX provided on the mask MK1 is precisely controlled by repeating sequence SQ1.

As described above, in a series of steps of sequence SQ1 and step ST4, the protective film SX is conformally formed on the silicon compound on the surface of the mask MK1 by the same method as the ALD method, so that the strength of protection against the mask MK1 is improved, and the protective film SX protecting the mask MK1 can be formed with a uniform film thickness.

The protective film SX formed in the series of steps of sequence SQ1 and step ST4 includes an area R1, an area R2 and an area R3, as shown in part (b) of FIG. 3. The area R3 is the area extending along the side surface on the side surface of the mask MK1. The area R3 extends from the surface of the antireflection film AL to the lower side of the area R1. The area R1 extends on the upper surface of the mask MK1 and on the area R3. The area R2 extends between adjacent areas R3, and on the surface of the antireflection film AL. As described above, in sequence SQ1, the protective film SX is formed as in the ALD method, so that the area R1, the area R2, and the area R3 have substantially the same film thickness, regardless of the density of the mask MK1.

In step ST5 subsequent to step ST4, the protective film SX is etched (etchback) so as to remove the area R1 and the area R2. For removal of the area R1 and the area R2, anisotropic etching conditions are necessary. Therefore, in step ST5, a processing gas including fluorocarbon-based gas from the gas source selected from among a plurality of gas sources of the gas source group 40 is supplied into the processing container 12. Then, radio-frequency power is supplied from the first radio-frequency power supply 62, radio frequency bias power is supplied from the second radio-frequency power supply 64, and the pressure of the space inside the processing container 12 is set to a preset pressure by operating the exhaust device 50. In this way, plasma of fluorocarbon-based gas is generated. The fluorine-containing active species in the generated plasma preferentially etches the area R1 and the area R2 by attraction in the vertical direction by the radio frequency bias power. As a result, as shown in part (c) of FIG. 3, the area R1 and the area R2 are selectively removed, and the mask MS is formed by the remaining area R3. The mask MS and the mask MK1 constitutes the mask MK2 on the surface of the antireflection film AL.

Subsequent to step ST5, a series of steps of sequence SQ2 to step ST7 are executed. A series of steps of sequence SQ2 to step ST7 are steps of etching the antireflection film AL.

First, sequence SQ2 (second sequence) is executed once (unit cycle) or more, subsequent to step ST5. Sequence SQ2 is a series of steps for precisely etching the area of the antireflection film AL not covered with the mask MK2 with a high selection ratio regardless of the density of the mask MK2 by the same method as the atomic layer etching (ALE) method, and includes step ST6a (fifth step), step ST6b (sixth step), step ST6c (seventh step), and step ST6d (eighth step) sequentially executed in sequence SQ2.

In step ST6a, plasma of a third gas is generated in the processing container 12, and a mixed layer MX including radicals contained in the plasma is formed in the atomic layer of the surface of the antireflection film AL. In step ST6a, in a state where the wafer W is placed on the electrostatic chuck ESC, a third gas is supplied into the processing container 12 to generate plasma of the third gas. The third gas is an etchant gas suitable for etching of the antireflection film AL including silicon, including fluorocarbon-based gas and rare gas, which can be for example, $C_xF_y$/Ar gas. $C_xF_y$ can be $CF_4$. Specifically, the third gas including fluorocarbon-based gas and rare gas from the gas source selected from among the plurality of gas sources of the gas source group 40 is supplied into the processing container 12. Then, radio-frequency power is supplied from the first radio-frequency power supply 62, radio frequency bias power is supplied from the second radio-frequency power supply 64, and the pressure of the space inside the processing container 12 is set to a preset pressure by operating the exhaust device 50. In this way, plasma of the third gas is generated in the processing container 12. The plasma of the third gas contains carbon radicals and fluorine radicals.

FIG. 6 is a diagram illustrating the principle of etching in the method (sequence SQ2) illustrated in FIG. 1. In FIG. 6, hollow circles (white circles) indicate atoms constituting the antireflection film AL, solid circles (black circles) indicate radicals, and "+" surrounded by circles indicates the ions of atoms of rare gas (for example, ions of Ar atom) included in a fourth gas to be described later. As shown in part (a) of FIG. 6, in step ST6a, carbon radicals and fluorine radicals contained in the plasma of the third gas are supplied to the atomic layer of the surface of the antireflection film AL. In this way, in step ST6a, the mixed layer MX including atoms constituting the antireflection film AL, carbon radicals and fluorine radicals is formed in the atomic layer of the surface of the antireflection film AL (see the part (a) of FIG. 6 and the part (c) of FIG. 3).

As described above, since the third gas includes fluorocarbon-based gas, in step ST6a, fluorine radicals and carbon radicals are supplied to the atomic layer of the surface of the antireflection film AL, and the mixed layer MX including both radicals can be formed in the atomic layer of the surface.

In addition, in the mask MK1 of the ArF resist, Si of the mask MS included in the mask MK2 and the carbon radicals contained in the plasma of the third gas function as a protective film. In addition, the adjustment of the amount of fluorine radicals can be controlled by a DC voltage by the power supply 70.

In step ST6b subsequent to step ST6a, the space inside the processing container 12 is purged. Specifically, the third gas supplied in step ST6a is exhausted. In step ST6b, as the purge gas, an inert gas such as nitrogen gas or rare gas (for example, Ar gas or the like) may be supplied to the processing container 12. That is, the purging in step ST6b may be any one of gas purging to flow inert gas into the processing container 12, or purging by evacuating.

In step ST6c subsequent to step ST6b, plasma of a fourth gas is generated in the processing container 12 and a bias voltage is applied to the plasma to remove the mixed layer MX. The fourth gas includes rare gas, and may include, for example, Ar gas. Specifically, a fourth gas including rare gas (for example, Ar gas) is supplied from the selected gas source among the plurality of gas sources of the gas source group 40 into the processing container 12, radio-frequency power is supplied from the first radio-frequency power supply 62, radio frequency bias power is supplied from the second radio-frequency power supply 64, and the pressure in the space inside the processing container 12 is set to a preset pressure by operating the exhaust device 50. In this way, plasma of the fourth gas is generated in the processing container 12. The ions of the atom of the fourth gas in the generated plasma (for example, the ions of Ar atom) collide with the mixed layer MX in the surface of the antireflection film AL by attraction in the vertical direction by the radio frequency bias power, and the energy is supplied to the mixed layer MX. As shown in the part (b) of FIG. 6, in step ST6c, energy is supplied to the mixed layer MX formed in the surface of the antireflection film AL through the ions of the atoms of the fourth gas, and this energy removes the mixed layer MX from the antireflection film AL.

As described above, since the fourth gas includes rare gas, in step ST6c, the mixed layer MX formed in the surface of the antireflection film AL can be removed from the surface by energy received by plasma of the rare gas by a bias voltage.

In step ST6d subsequent to step ST6c, the space inside the processing container 12 is purged. Specifically, the fourth gas supplied in step ST6c is exhausted. In step ST6d, as the purge gas, an inert gas such as nitrogen gas or rare gas (for example, Ar gas or the like) may be supplied to the processing container 12. That is, the purging in step ST6d may be any one of gas purging to flow inert gas into the processing container 12, or purging by evacuating. As shown in the part (c) of FIG. 6, by purging performed in step ST6c, atoms constituting the mixed layer MX in the surface of the antireflection film AL and excessive ions contained in the plasma of the fourth gas (for example, ions of Ar atom) can be sufficiently removed.

In step ST7 subsequent to sequence SQ2, it is determined whether or not to end the execution of sequence SQ2. Specifically, in step ST7, it is determined whether or not the number of executions of sequence SQ2 has reached the preset number. To determine the number of executions of sequence SQ2 is to determine the extent (depth) of etching for antireflection film AL. Sequence SQ2 can be repeated so as to etch the antireflection film AL to the surface of the organic film OL. That is, the execution number of sequence SQ2 can be determined such that the product of the thickness of the antireflection film AL etched by executing sequence SQ2 once (unit cycle) and the number of executions of sequence SQ2 is the total thickness of the antireflection film AL itself. Therefore, according to the thickness of the antireflection film AL, the number of executions of sequence SQ2 can be set.

In a case where it is determined in step ST7 that the number of executions of sequence SQ2 has not reached the preset number (step ST7: NO), the execution of sequence SQ2 is repeated again. On the other hand, in a case where it is determined in step ST7 that the number of executions of sequence SQ2 has reached the preset number (step ST7: YES), the execution of sequence SQ2 is ended. Thus, as shown in part (a) of FIG. 4, the antireflection film AL is etched and a mask ALM is formed. That is, by repeating sequence SQ2 by a preset number of times, the antireflection film AL is etched at the same and uniform width as the width of the opening OP2 provided by the mask MK2 regardless of the density of the mask MK2 (the density of the mask MK1), and the selection ratio is also improved.

The mask ALM and the mask MK2 provide an opening OP3. The mask MK2 (mask MK1) on the mask ALM has a height of a value of HG2 [nm]. The opening OP3 has the same width as the width of the opening OP 2 provided by mask MK2 (see the part (c) of FIG. 3). The mask MK2 and the mask ALM constitute the mask MK 3 for the organic film OL. The value (W3 [nm]) of the width of the opening OP3 provided by the mask MK3 including the mask MK2 and the mask ALM is the same as the value of width of the opening OP2 provided by the mask MK2. The width of the opening OP3 formed by etching the antireflection film AL is controlled with high accuracy by repeating sequence SQ2.

Further, since a stable silicon oxide film with a uniform and precisely controlled film thickness is formed on the side of the mask MK2 on the antireflection film AL in a series of steps up to step ST5, the influence on the shape (LWR and LER) of the mask MK2 due to etching of the antireflection film AL in sequence SQ2 can be reduced. In this way, since the influence on the shape of the mask MK2 due to etching in sequence SQ2 can be reduced, the influence on the width of the opening OP3 formed by etching due to etching in sequence SQ2 can also be reduced and the influence due to the density of the mask MK2 (the density of the mask MK1) can be reduced.

As described above, a series of steps of sequence SQ2 to step ST7 is a step executed after executing the step of conformally forming a silicon oxide film (the area R3 (mask MS) of the protective film SX) on the surface of the mask MK1 (after execution of step ST5), and is a step of precisely etching the antireflection film AL by repeating sequence SQ2 by using the mask MK1 (mask MK2) on which the mask MS is formed to remove the antireflection film AL for each atomic layer. Therefore, in a series of steps of sequence SQ2 to step ST7, the antireflection film AL can be removed for each atomic layer by the same method as the ALE method.

In step ST8 subsequent to step ST7: YES, the organic film OL is etched. In step ST8, after executing sequence SQ1 to step ST7 in which the etching process is performed on the antireflection film AL (after step ST7: YES), by using the plasma generated in the processing container 12, the etching process is performed on the organic film OL by using the mask MK3 (second mask). The mask MK3 is formed from the antireflection film AL in the step of etching the antireflection film AL (sequence SQ1 to step ST7).

The process of step ST8 will be specifically described. First, a processing gas including nitrogen gas and hydrogen gas is supplied into the processing container 12 from the gas source selected from among the plurality of gas sources of the gas source group 40. As the gas, a processing gas including oxygen may be used. Then, radio-frequency power is supplied from the first radio-frequency power supply 62, radio frequency bias power is supplied from the second radio-frequency power supply 64, and the pressure of the space inside the processing container 12 is set to a predetermined pressure by operating the exhaust device 50. Thus, plasma of the processing gas including nitrogen gas and hydrogen gas is generated. Hydrogen radicals, which are the active species of hydrogen in the generated plasma, etch the area exposed from the mask MK 3 of the entire area of the organic film OL. As described above, as shown in part (b) of FIG. 4, the organic film OL is etched, so that a mask OLM having the opening OP4 with the same width as the width of the opening OP3 provided by the mask MK3 (see the part (a) of FIG. 4) is formed from the organic film OL. The mask ALM and the mask OLM constitute a mask MK4 for the layer EL to be etched. The value of the width of the opening OP4 provided by the mask MK4 is the same as the value (W4 [nm]) of the width (W3 [nm]) of the opening OP3 provided by the mask MK3. Since the width uniformity of the opening OP3 of the mask MK3 is improved by sequence SQ2 regardless of the density of the mask MK3 (density of the mask MK2) and the shape (LWR and LER) of the mask MK3 is also good, the width uniformity of the opening OP4 of the mask MK4 is also improved regardless of the density of the mask MK4 (density of the mask MK3) and the shape (LWR and LER) of the mask MK4 is also good.

As described above, by executing a series of steps from step ST2 to ST7, a mask MK3 whose shape is maintained and selection ratio is improved is formed on the organic film OL regardless of the density of the mask, so that the etching of the organic film OL by using the mask MK3 of such a good shape is possible and the organic film OL can be etched well.

An experiment performed using the plasma processing apparatus 10 for evaluating the method MT will be described below. Experiments are performed on a wafer (dense) and a wafer (sparse) with the following configuration. The wafer (dense) and the wafer (sparse) are examples of the wafer W. The wafer (dense) is formed with a mask in a dense state, and the wafer (sparse) is formed with a mask in a sparse state.

<Wafer (Dense)>
* The ratio (W1:W2) between a value (W1 [nm]) of the mask width of the mask MK1 and a value (W2 [nm]) of the width of the opening OP1: one to one (1:1)
* Value (HG1 [nm]) of the mask height of the mask MK1: 40 [nm]
* Value (W2 [nm]) of the width of the opening OP1 of the mask MK1: 45.0 [nm]

<Wafer (Sparse)>
* The ratio (W1:W2) between a value (W1 [nm]) of the mask width of the mask MK1 and a value (W2 [nm]) of the width of the opening OP1: one to five (1:5)
* Value (HG1 [nm]) of the mask height of the mask MK1: 40 [nm]
* Value (W2 [nm]) of width of the opening OP1 of the mask MK1: 225 [nm]

Instead of a series of processes of steps ST2 to ST8, by etching the antireflection film AL and the organic film OL by normal reactive ion etching (RIE) under the following conditions, on each of the wafer (dense) and the wafer (sparse), the following results are obtained.
<Conditions>
(Etching of Antireflection Film AL)
* Value [mTorr] of pressure in processing container 12: 15 [mTorr]
* Frequency value [MHz] of first radio-frequency power supply 62 and value [W] of radio-frequency power: 60 [MHz], 400 [W]
* Frequency value [MHz] of second radio-frequency power supply 64 and value [W] of bias power: 13.56 [MHz], 100 [W]
* Processing gas: $CF_4$ gas
* Flow rate [sccm] of processing gas: 150 [sccm]
* Processing time [s]: 30 [s]
(Etching of Organic Film OL)
* Value [mTorr] of pressure in processing container 12: 20 [mTorr]
* Frequency value [MHz] of first radio-frequency power supply 62 and value [W] of radio-frequency power: 60 [MHz], 1000 [W]
* Frequency value [MHz] of second radio-frequency power supply 64 and value [W] of bias power: 13.56 [MHz], 200 [W]
* Processing gas: $N_2/H_2$ gas
* Flow rate [sccm] of processing gas: ($N_2$ gas) 200 [sccm], ($H_2$ gas) 200 [sccm]
* Processing time [s]: 40 [s]

In a series of processes of steps ST1 to ST8, instead of a series of processes of steps ST2 to ST5, by only performing step ST1, sequence SQ2 (step ST6a to ST6d), step ST7 and step ST8, the antireflection film AL and the organic film OL are etched on each of the wafer (dense) and the wafer (sparse), and the following results are obtained.
<Conditions>
(Supply of First Gas: step ST6a)
* Value [mTorr] of pressure in processing container 12 in step ST6a: 30 [mTorr]
* Frequency value [MHz] of first radio-frequency power supply 62 and value [W] of radio-frequency power in step ST6a: 60 [MHz], 100 [W]
* Frequency value [MHz] of second radio-frequency power supply 64 and value [W] of bias power in step ST6a: 13.56 [MHz], 0 [W]
* Value [V] of DC voltage of power supply 70: −1000 [V]
* Processing gas in step ST6a: $CF_4$/Ar gas
* Flow rate [sccm] of processing gas in step ST6a: ($CF_4$ gas) 300 [sccm], (Ar gas) 300 [sccm]
* Processing time [s] in step ST6a: 10 [s]
(Plasma Generation of Second Gas: step ST6c)
* Value [mTorr] of pressure in processing container 12 in step ST6c: 30 [mTorr]
* Frequency value [MHz] of first radio-frequency power supply 62 and value [W] of radio-frequency power in step ST6c: 60 [MHz], 100 [W]

* Frequency value [MHz] of second radio-frequency power supply 64 and value [W] of bias power in step ST6c: 13.56 [MHz], 30 [W]
* Processing gas in step ST6c: Ar gas
* Flow rate [sccm] of processing gas in step ST6c: 300 [sccm]
* Processing time [s]: 25 [s]

(Determination as to End of Sequence SQ2: Step S7)
* Number of repetitions of sequence SQ2: 30 times (Etching of Organic Film OL: Step ST8)
* Value [mTorr] of pressure in processing container 12: 20 [mTorr]
* Frequency value [MHz] of first radio-frequency power supply 62 and value [W] of radio-frequency power: 60 [MHz], 1000 [W]
* Frequency value [MHz] of second radio-frequency power supply 64 and value [W] of bias power: 13.56 [MHz], 200 [W]
* Processing gas: $N_2/H_2$ gas
* Flow rate [sccm] of processing gas: ($N_2$ gas) 200 [sccm], ($H_2$ gas) 200 [sccm]
* Processing time [s]: 45 [s]

By performing a series of processes of steps ST1 to ST8 on each of the wafer (dense) and the wafer (sparse), the antireflection film AL and the organic film OL are etched, and the following results are obtained.

<Conditions>
(Secondary Electron Irradiation: Step ST2)
* Value [mTorr] of pressure in processing container 12: 30 [mTorr]
* Frequency value [MHz] of first radio-frequency power supply 62 and value [W] of radio-frequency power: 60 [MHz], 100 [W]
* Frequency value [MHz] of second radio-frequency power supply 64 and value [W] of bias power: 13.56 [MHz], 0 [W]
* Value [V] of DC voltage of power supply 70: −1000 [V]
* Processing gas: $H_2$/Ar gas
* Flow rate [sccm] of processing gas: ($H_2$ gas) 60 [sccm], (Ar gas) 300 [sccm]
* Processing time [s]: 10 [s]

(Supply of First Gas: Step ST3a)
* Value [mTorr] of pressure in processing container 12: 500 [mTorr]
* Frequency value [MHz] of first radio-frequency power supply 62 and value [W] of radio-frequency power: 60 [MHz], 0 [W]
* Frequency value [MHz] of second radio-frequency power supply 64 and value [W] of bias power: 13.56 [MHz], 0 [W]
* Processing gas: organic-containing aminosilane-based gas
* Flow rate [sccm] of processing gas: 50 [sccm]
* Processing time [s]: 15 [s]

(Supply of Second Gas: Step ST3c)
* Value [mTorr] of pressure in processing container 12: 200 [mTorr]
* Frequency value [MHz] of first radio-frequency power supply 62 and value [W] of radio-frequency power: 60 [MHz], 300 [W]
* Pulse frequency: 10 [kHz], 50%
* Frequency value [MHz] of second radio-frequency power supply 64 and value [W] of bias power: 13.56 [MHz], 0 [W]
* Processing gas: $CO_2$ gas
* Flow rate [sccm] of processing gas: 300 [sccm]
* Processing time [s]: 5 [s]

(Determination as to End of Sequence SQ1: Step S4)
* Number of repetitions of sequence SQ1: 20 times (Etchback: step ST5)
* Value [mTorr] of pressure in processing container 12: 50 [mTorr]
* Frequency value [MHz] of first radio-frequency power supply 62 and value [W] of radio-frequency power: 60 [MHz], 300 [W]
* Frequency value [MHz] of second radio-frequency power supply 64 and value [W] of bias power: 13.56 [MHz], 150 [W]
* Value [V] of DC voltage of power supply 70: 0[V]
* Processing gas: $CF_4$ gas
* Flow rate [sccm] of processing gas: 150 [sccm]
* Processing time [s]: 4 [s]

(Plasma Generation of Third Gas: Step ST6a)
* Value [mTorr] of pressure in processing container 12 in step ST6a: 30 [mTorr]
* Frequency value [MHz] of first radio-frequency power supply 62 and value [W] of radio-frequency power in step ST6a: 60 [MHz], 100 [W]
* Frequency value [MHz] of second radio-frequency power supply 64 and value [W] of bias power in step ST6a: 13.56 [MHz], 0 [W]
* Value [V] of DC voltage of power supply 70: −1000 [V]
* Processing gas in step ST6a: $CF_4$/Ar gas
* Flow rate [sccm] of processing gas in step ST6a: ($CF_4$ gas) 300 [sccm], (Ar gas) 300 [sccm]
* Processing time [s] in step ST6a: 10 [s]

(Plasma Generation of Fourth Gas: Step ST6c)
* Value [mTorr] of pressure in processing container 12 in step ST6c: 30 [mTorr]
* Frequency value [MHz] of first radio-frequency power supply 62 and value [W] of radio-frequency power in step ST6c: 60 [MHz], 100 [W]
* Frequency value [MHz] of second radio-frequency power supply 64 and value [W] of bias power in step ST6c: 13.56 [MHz], 0 [W]
* Value [V] of DC voltage of power supply 70: 0[V]
* Processing gas in step ST6c: Ar gas
* Flow rate [sccm] of processing gas in step ST6c: 300 [sccm]
* Processing time [s]: 25 [s]

(Determination as to End of Sequence SQ2: Step S7)
* Number of repetitions of sequence SQ2: 30 times (Etching of Organic Film OL: Step ST8)
* Value [mTorr] of pressure in processing container 12: 20 [mTorr]
* Frequency value [MHz] of first radio-frequency power supply 62 and value [W] of radio-frequency power: 60 [MHz], 1000 [W]
* Frequency value [MHz] of second radio-frequency power supply 64 and value [W] of bias power: 13.56 [MHz], 200 [W]
* Processing gas: $N_2/H_2$ gas
* Flow rate [sccm] of processing gas: ($N_2$ gas) 200 [sccm], ($H_2$ gas) 200 [sccm]
* Processing time [s]: 45 [s]

The principle of the present invention has been illustrated and described above in the preferable embodiments, but it is recognized by a person skilled in the art that the present invention can be modified in arrangements and details without deviating from such a principle. The present invention is not limited to the specific configuration disclosed in the present embodiment. Accordingly, a right to make all amendments and changes that come from the scope of the claim and the scope of spirit is claimed.

REFERENCE SIGNS LIST

10 . . . PLASMA PROCESSING APPARATUS; 12 . . . PROCESSING CONTAINER; 12e . . . EXHAUST PORT; 12g . . . LOADING/UNLOADING PORT; 14 . . . SUPPORT PORTION; 18a . . . FIRST PLATE; 18b . . . SECOND PLATE; 22 . . . DC POWER SUPPLY; 23 . . . SWITCH; 24 . . . COOLANT FLOW PATH; 26a . . . PIPING; 26b . . . PIPING; 28 . . . GAS SUPPLY LINE; 30 . . . UPPER ELECTRODE; 32 . . . INSULATING SHIELDING MEMBER; 34 . . . ELECTRODE PLATE; 34a . . . GAS DISCHARGE HOLE; 36 . . . ELECTRODE SUPPORT; 36a . . . GAS DIFFUSION CHAMBER; 36b . . . GAS PASSAGE HOLE; 36c . . . GAS INLET; 38 . . . GAS SUPPLY PIPE; 40 . . . GAS SOURCE GROUP; 42 . . . VALVE GROUP; 44 . . . FLOW RATE CONTROLLER GROUP; 46 . . . DEPOSIT SHIELD; 48 . . . EXHAUST PLATE; 50 . . . EXHAUST DEVICE; 52 . . . EXHAUST PIPE; 54 . . . GATE VALVE; 62 . . . FIRST RADIO-FREQUENCY POWER SUPPLY; 64 . . . SECOND RADIO-FREQUENCY POWER SUPPLY; 66 . . . MATCHING UNIT; 68 . . . MATCHING UNIT; 70 . . . POWER SUPPLY; AL . . . ANTIREFLECTION FILM; ALM . . . MASK; Cnt . . . CONTROL UNIT; EL . . . LAYER TO BE ETCHED; ESC . . . ELECTROSTATIC CHUCK; FR . . . FOCUS RING; G1 . . . FIRST GAS; HP . . . HEALER POWER SUPPLY; HT . . . HEATER; LE . . . LOWER ELECTRODE; Ly1 . . . LAYER; Ly2 . . . LAYER; MK1 . . . MASK; MK2 . . . MASK; MK3 . . . MASK; MK4 . . . MASK; MS . . . MASK; OL . . . ORGANIC FILM; OLM . . . MASK; OP1 . . . OPENING; OP2 . . . OPENING; OP3 . . . OPENING; OP4 . . . OPENING; P1 . . . PLASMA; PD . . . PLACEMENT TABLE; R1 . . . AREA; R2 . . . AREA; R3 . . . AREA; S . . . PROCESSING SPACE; SB . . . SUBSTRATE; SX . . . PROTECTIVE FILM; W . . . WAFER.

The invention claimed is:

1. A method for processing a workpiece, comprising:
providing, in a processing container, a workpiece including a layer to be etched, an organic film provided on the layer, an antireflection film provided on the organic film, and a first mask provided on the antireflection film,
conformally forming a protective film on a surface of the first mask; and
removing the antireflection film by atomic layer etching with plasma using the first mask on which the protective film is formed.

2. The method according to claim 1, further comprising:
irradiating the first mask with secondary electrons by generating plasma in the processing container and applying a negative DC voltage to an upper electrode of a parallel plate electrode provided in the processing container before the conformally forming of the protective film.

3. The method according to claim 2,
wherein an electrode plate of the upper electrode includes silicon, and
wherein the irradiating of the first mask with secondary electrons comprises generating plasma in the processing container and applying a negative DC voltage to the upper electrode to release silicon from the electrode plate and to cover the first mask with silicon oxide.

4. The method according to claim 1,
wherein the conformally forming of the protective film, on the surface of the first mask by repeating a first sequence including
supplying a first gas into the processing container without generating plasma from the first gas,
purging a space inside the processing container,
generating plasma of a second gas in the processing container, and
purging the space inside the processing container.

5. The method according to claim 4,
wherein the first gas includes aminosilane-based gas.

6. The method according to claim 5,
wherein the aminosilane-based gas of the first gas contains aminosilane having one to three silicon atoms.

7. The method according to claim 5,
wherein the aminosilane-based gas of the first gas contains aminosilane having one to three amino groups.

8. The method according to claim 4,
wherein the second gas includes gas containing oxygen atoms and carbon atoms.

9. The method according to claim 1,
wherein the removing of the antireflection film by atomic layer etching includes repeating a second sequence including
generating plasma of a third gas in the processing container and forming a mixed layer including radicals contained in the plasma on the surface of the antireflection film,
purging a space inside the processing container,
generating plasma of a fourth gas in the processing container and applying a bias voltage to the plasma to remove the mixed layer, and
purging a space inside the processing container.

10. The method according to claim 9,
wherein the third gas includes fluorocarbon-based gas and rare gas.

11. The method according to claim 9,
wherein the fourth gas includes rare gas.

12. The method according to claim 1, further comprising:
etching the organic film using a second mask with plasma generated in the processing container,
wherein the second mask is formed of the first mask and the antireflection film in the etching of the antireflection film.

13. A method for processing a workpiece, the method comprising:
providing the workpiece including an antireflection film and a mask on the antireflection film;
forming a protective film on the mask; and
etching the antireflection film through the mask on which the protective film is formed,
wherein the forming includes:
supplying a first gas onto the workpiece and forming a precursor layer on the workpiece, and
generating a plasma from a second gas and modifying the precursor layer, and wherein the etching includes:
generating a plasma from a third gas and forming a mixed layer in the antireflection film, and
generating a plasma from a fourth gas and removing the mixed layer.

14. The method according to claim 13, wherein the forming includes repeating
the supplying a first gas onto the workpiece and forming a precursor layer on the workpiece, and
the generating a plasma from a second gas and modifying the precursor layer.

15. The method according to claim 13, wherein the etching includes repeating
   the generating a plasma from a third gas and forming a mixed layer in the antireflection film, and
   the generating a plasma from a fourth gas and removing the mixed layer.

16. The method according to claim 13, wherein the workpiece includes an organic film and a layer to be etched below the antireflection film.

17. The method according to claim 16, further comprising:
   etching the organic film after the etching of the antireflection film.

18. The method according to claim 17, further comprising etching the layer to be etched after the etching of the organic film.

19. The method according to claim 13, wherein the forming and the etching are performed in a same processing container.

20. The method according to claim 13, wherein the protective film includes silicon oxide.

* * * * *